United States Patent [19]

Kuny

[11] 4,160,219

[45] Jul. 3, 1979

[54] TRANSDUCER ELECTRODES FOR FILTERS OR DELAY LINES UTILIZING SURFACE WAVE PRINCIPLES

[75] Inventor: Wilhelm Kuny, Gruenwald, Fed. Rep. of Germany

[73] Assignee: Siemens Aktiengesellschaft, Berlin & Munich, Fed. Rep. of Germany

[21] Appl. No.: 783,837

[22] Filed: Apr. 1, 1977

[30] Foreign Application Priority Data

Apr. 26, 1976 [DE] Fed. Rep. of Germany ....... 2618210

[51] Int. Cl.² .................. H03H 9/04; H03H 9/30; H03H 9/26; H01L 41/10
[52] U.S. Cl. .................. 333/151; 310/313; 333/194
[58] Field of Search .......... 333/30 R, 72, 71; 310/313; 330/5.5; 331/107 A; 358/21, 31, 188

[56] References Cited

U.S. PATENT DOCUMENTS

| | | | |
|---|---|---|---|
| 3,663,899 | 5/1972 | Dieulesaint et al. | 333/72 X |
| 3,768,032 | 10/1973 | Mitchell | 333/72 X |
| 4,023,124 | 5/1977 | Parker et al. | 333/72 |

OTHER PUBLICATIONS

Mason et al., "Physical Acoustics", Academic Press, 1970, New York and London, Title page and pp. 229–233.

Primary Examiner—Alfred E. Smith
Assistant Examiner—Marvin Nussbaum
Attorney, Agent, or Firm—Hill, Van Santen, Steadman, Chiara & Simpson

[57] ABSTRACT

The invention relates to transducer electrodes for filters or delay lines using surface wave principles on piezoelectric substrates wherein parallel mounted electrodes have interdigital fingers extending toward the electrodes and wherein feeders for the fingers have widths of one half the wave length of the surface wave at the mean filter frequency so as to equalize and eliminate reflections in the device.

8 Claims, 1 Drawing Figure

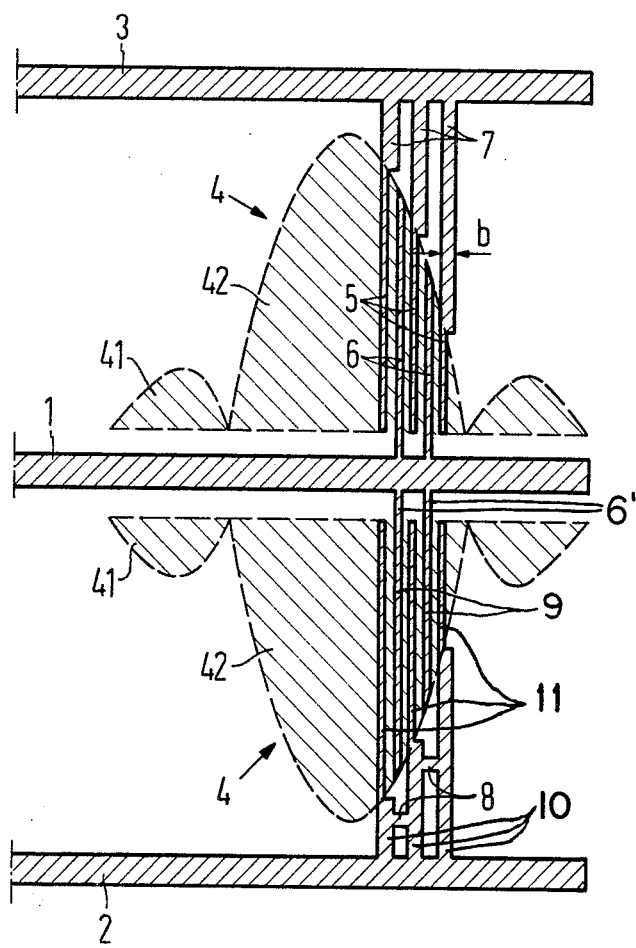

TRANSDUCER ELECTRODES FOR FILTERS OR DELAY LINES UTILIZING SURFACE WAVE PRINCIPLES

BACKGROUND OF THE INVENTION

1. Field of the Invention

This invention relates in general to transducer electrodes for filters or delay lines utilizing the surface wave principle on piezoelectric substrates utilizing transducers formed with longitudinally weighted interdigital electrode fingers and with wider feeder portions.

2. Description of the Prior Art

It has been known that metallized surfaces on piezoelectric substrates reduce the propagation velocity of elastic surface waves in filters or delay lines. For interdigital transducers for elastic surface waves with longitudinally weighted electrode fingers, for example, this effect causes part of the wave front in the electrode finger overlap zone to pass through a comparatively heavily metallized zone whereas other parts of the wave front outside the overlap zone pass through a zone where the metallization is relatively small. The wave components passing through the smaller metallized zone lead the wave components passing through the greater metallized zone resulting in undesired distortion of the wave front and, thus, causes discrepancies in the experimental frequency response relative to the desired frequency response of the transmission element.

So as to eliminate this leading edge effect, it has been known to compensate for the difference in metallization outside the finger electrode overlap zone to provide so-called dummy fingers. Such dummy fingers can be either insulated from the other electrode fingers or connected electrically with adjacent electrode fingers.

Such known dummy fingers have been the same width as the other electrode fingers, in other words about one quarter of the synchronous wave length of the surface wave. Thus, a disadvantage is that the reflections of the surface wave at the finger edges are added at the synchronous frequency impairing the amplitude and phase frequency response precisely in the middle of the transmission band. So as to eliminate these undesired reflections, one solution has been previously proposed to form the electrode fingers as so-called split-fingers. For this purpose, each electrode finger is formed as a double finger but this produces an undesirable result in that the narrower metallized zones are very difficult to produce since they are very delicate and also they have a higher ohmic resistance and, thus, increase the electrical energy losses.

SUMMARY OF THE INVENTION

It is an object of the present invention to provide a transit time compensating means for elastic surface waves in the peripheral zone of longitudinally weighted interdigital transducers that are easy to manufacture and cause no additional reflections at the finger edges and which does not produce high losses of electrical energy.

In the present invention, this object is achieved by providing electrode fingers outside the active overlap zone which include feeders that have a width of b approximately equal to $\lambda_0/2$ which equals $v/2f_0$. ($\lambda_0$ = wavelength of the surface wave at the mean filter frequency $f_0$; and $v$ = wave velocity).

Utilizing feeders with this width produces the advantage that the reflection components originating from the front and rear edges of the feeders are mutually equalized so that the transmission band of the filter remains free of edge reflection problems caused by the feeders and because of the low internal resistance of the feeders, the area covered with the feeders forms a more precise equipotential area than that of the prior art dummy fingers. Also, a difference in transit time caused by differing widths of metallization areas is eliminated by the present invention.

A preferable embodiment of the invention provides that the width of the feeders can be varied inside the filter frequency band such that either each feeder individually or groups of feeders can be tuned to mutually differing synchronous frequencies. This assures that the metal reflections can be kept small in very broad band transmission elements.

Additional connecting webbing which interconnects the feeders improves further the effect of the area covered by the feeders to provide an equipotential area.

Preferably the feeders are connected to the grounded transducer electrode and form part of the static shielding between the input and output transducers of the filter or the delay line.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWING

The drawing illustrates in plan view three electrodes with the interdigital fingers and feeders of the invention.

DESCRIPTION OF THE PREFERRED EMBODIMENTS

The FIGURE illustrates three parallel mounted electrodes 1, 2 and 3 with the "hot" electrode 1 mounted between the electrodes 2 and 3 which are both connected to a reference potential as, for example, ground. It is to be realized that the electrodes 1, 2 and 3 are formed of metallized areas on a piezoelectric substrate. Fingers 6 of differing lengths extend from electrode 1 toward the electrode 3 as shown. Electrodes 6' extend outwardly from electrode 1 toward the electrode 2 as shown. Feeder electrodes 7 of different lengths extend from the electrode 3 toward the electrode 1 and interdigital fingers 5 of different lengths extend from the ends of the feeder electrode 7 toward the electrode 1 as shown and are interdigitally arranged with the electrodes 6. Feeder electrodes 10 extend from the electrode 2 toward the electrode 1 and interdigital electrode fingers 11 are connected to the ends of the feeder electrodes 10 and are of different lengths. Fingers 9 of different lengths are interdigitally arranged between the electrode fingers 11 as shown. The ends of the electrodes 5 terminate approximately the same distance from the electrode 1 and the ends of the electrodes 11 terminate approximately the same distance from the electrode 1 as shown.

The zone 4 shown in light shading in which the finger electrodes 5 and 6 (9 and 11) overlap corresponds to the function $y = \sin x/x$.

The width of the feeders 7 and 10 which extend from the end of the finger electrodes 5 and 11 to the electrodes 3 and 2 is equal to one half the wave length of the surface wave. A further reduction in the ohmic resistance can be obtained by utilizing the transverse webbing conductive portions 8 between the feeders 10 as shown.

From the drawing it can be observed that, for example, the surface wave components generated in the area 41 of the overlap zone 4 would pass through a zone with much higher metallization density than those generated in the outer lobes of the area 42 if equalization did not occur by the widening of the feeder electrodes 7 and 10.

In the case where the electrode fingers 5 and 6 and the inner spaces between the electrode fingers 5 and 6 are not equal in other words do not have a width of a quarter of a wave length, the metallized area inside and outside the overlap zone could be different. If the width of the electrode fingers in the overlap zone is reduced thereby making the metallized area smaller this must be compensated for outside the overlap zone by reducing the number of feeders rather than by reducing the width of the feeders. In this event, it is then possible to connect a plurality of electrode fingers to a single feeder.

Although the invention has been described with respect to preferred embodiments, it is not to be so limited, as changes and modifications may be made which are within the full intended scope as defined by the appended claims.

I claim as my invention:

1. Transducer electrodes on piezoelectric substrates for passband filters or delay lines utilizing surface waves wherein the transducers are in the form of interdigital structures with longitudinally weighted electrode fingers (5, 6, 9, 11) the width of which is $\lambda_0/4$ and the distance between centers of adjacent fingers is $\lambda_0/2$, characterized in that outside of the active overlap zone (4) the electrode fingers (5, 11) are fed by feeders (7, 10) with a width of $b \approx \lambda_0/2 = v/2f_0$ where $\lambda_0 =$ the wavelength of the surface wave at the center frequency $f_0$; and $v =$ propagation velocity of the surface wave, and the distance between centers of adjacent feeders (7, 10) is $\lambda_0$.

2. Transducer electrodes as in claim 1 characterized in that the width "b" of the feeders (7, 11) is varied within the filter frequency band between $b_u = v/2f_u$ and $b_l = v/2f_l$, $f_u$ and $f_l$ being upper and lower characteristic frequencies respectively terminating the frequency band being used.

3. Transducer electrodes as in claim 1 characterized in that feeders (11) are additionally interconnected by means of connecting webbing (8).

4. Transducer electrodes as in claim 1 characterized in that the feeders (7, 11) are connected with at least one of the grounded transducer electrodes (2, 3) and form part of the static shielding between the input and output transducers of the filter or delay line.

5. A passband filter or delay line device with transducer electrodes as in claim 1 comprising a piezoelectric substrate, first (1) and second metallized electrodes (3) mounted parallel to each other on said substrate, a first plurality of interdigital electrode fingers (6) of different lenghts extending from said first electrode (1) toward said second electrode (3), a first plurality of feeder electrodes (7) of different lengths attached to said second electrode (3) and of widths "b" $\approx \lambda_0/2 = v/2f_0$ where $\lambda_0 =$ the wavelength of the surface wave at the center frequency $f_0$ and "v" = the propagation velocity of the surface wave, and a second plurality of electrode fingers (5) of different lengths extending from the ends of said first plurality of feeder electrodes (7) and interdigitally arranged relative to said first plurality of electrode fingers (6).

6. A filter or delay line device according to claim 5 including a third meta-lized electrode (2) mounted parallel to said first (1) and second metallized electrodes (3) on said substrate, a third plurality of interdigital electrode fingers (9) of different lengths extending from said first electrode (1) toward said third electrode (2), a second plurality of feeder electrodes (10) with widths equal to the widths of said first plurality of feeder electrodes (7) extending from said third electrode (2) toward said first electrode (1), and a fourth plurality of electrode fingers (11) of different lengths extending from the ends of said second plurality of feeder electrodes (10) and interdigitally arranged relative to said third plurality of electrode fingers (9).

7. A filter or delay line according to claim 6 wherein said second and third electrodes (2, 3) are connected to a reference potential.

8. A filter or delay line according to claim 6 including jumper metallized areas (8) extending between said first plurality of feeder electrodes (7, 10).

* * * * *